(12) United States Patent
Hilt et al.

(10) Patent No.: US 8,901,671 B2
(45) Date of Patent: Dec. 2, 2014

(54) SCALABLE CONSTRUCTION FOR LATERAL SEMICONDUCTOR COMPONENTS HAVING HIGH CURRENT-CARRYING CAPACITY

(75) Inventors: Oliver Hilt, Schöneiche (DE); Hans-Joachim Wuerfl, Zeuthen (DE)

(73) Assignee: Forschungsverbund Berlin E.V., Berlin (DE)

( * ) Notice: Subject to any disclaimer, the term of this patent is extended or adjusted under 35 U.S.C. 154(b) by 57 days.

(21) Appl. No.: 13/578,584

(22) PCT Filed: Feb. 10, 2011

(86) PCT No.: PCT/EP2011/051985
§ 371 (c)(1),
(2), (4) Date: Aug. 10, 2012

(87) PCT Pub. No.: WO2011/098534
PCT Pub. Date: Aug. 18, 2011

(65) Prior Publication Data
US 2012/0306024 A1 Dec. 6, 2012

(30) Foreign Application Priority Data
Feb. 10, 2010 (DE) .......... 10 2010 001 788

(51) Int. Cl.
*H01L 27/088* (2006.01)
*H01L 29/66* (2006.01)
*H01L 29/423* (2006.01)
*H01L 23/482* (2006.01)

(52) U.S. Cl.
CPC ......... *H01L 23/4824* (2013.01); *H01L 2224/16* (2013.01); *H01L 29/42316* (2013.01); *H01L 23/4821* (2013.01)
USPC ...... 257/401; 257/341; 257/343; 257/E29.12; 257/E29.136

(58) Field of Classification Search
CPC ............ H01L 29/41758; H01L 29/4238; H01L 29/0692; H01I 23/4824; H01I 29/0696
USPC ............ 257/401, E29.136, E29.12, 341, 343
See application file for complete search history.

(56) References Cited

U.S. PATENT DOCUMENTS

| | | | |
|---|---|---|---|
| 5,465,007 A | 11/1995 | Ikeda et al. | |
| 5,635,742 A * | 6/1997 | Hoshi et al. | 257/337 |
| 5,672,894 A * | 9/1997 | Maeda et al. | 257/343 |
| 5,689,129 A * | 11/1997 | Pearce | 257/341 |
| 6,060,761 A | 5/2000 | Kawakita et al. | |
| 6,388,292 B1* | 5/2002 | Lin | 257/356 |
| 6,724,044 B2* | 4/2004 | Blanchard | 257/341 |
| 6,768,183 B2 | 7/2004 | Takahashi et al. | |
| 7,019,337 B2* | 3/2006 | Eden et al. | 257/107 |
| 7,132,717 B2* | 11/2006 | Su et al. | 257/401 |
| 7,982,280 B2* | 7/2011 | Sutardja | 257/503 |
| 2002/0076851 A1* | 6/2002 | Eden et al. | 438/106 |
| 2003/0136984 A1 | 7/2003 | Masuda et al. | 257/247 |
| 2004/0084776 A1* | 5/2004 | Fukuda et al. | 257/758 |
| 2004/0206983 A1* | 10/2004 | Yi et al. | 257/202 |
| 2005/0045697 A1* | 3/2005 | Lacap et al. | 228/180.22 |
| 2005/0133829 A1* | 6/2005 | Kunii et al. | 257/280 |
| 2007/0034903 A1* | 2/2007 | Sutardja | 257/202 |
| 2007/0105301 A1 | 5/2007 | Chen et al. | |
| 2008/0042221 A1 | 2/2008 | Tsau | |
| 2008/0157209 A1* | 7/2008 | Sutardja | 257/368 |
| 2008/0230920 A1 | 9/2008 | Behrens | |
| 2009/0039359 A1 | 2/2009 | Yoon et al. | |

FOREIGN PATENT DOCUMENTS

| | | |
|---|---|---|
| DE | 38 88 148 T2 | 9/1994 |
| DE | 69728648 T2 | 5/1998 |
| DE | 10303932 A1 | 3/2004 |
| EP | 1471581 | 10/2004 |
| EP | 1471581 A2 | 10/2004 |
| WO | 2007118032 A2 | 10/2007 |
| WO | WO2011/014951 | 2/2011 |

OTHER PUBLICATIONS

Field-effect transistor output driver, IBM Technical Disclosure Bulletin, International Business Machines Corp., vol. 28, No. 8, Jan. 1, 1986 XP002088269.
Hilleringmann, U., Silizium-Halbleitertechnologie, Kapitel 13.3.1; 5. Auflage, 2008, Vieweg and Teubner Verlag.

Hilleringmann, U., Silizium-Halbleitertechnologie, 5. Auflage, S. 295ff. 2008.

* cited by examiner

*Primary Examiner* — Cheung Lee
*Assistant Examiner* — Jeremy Joy
(74) *Attorney, Agent, or Firm* — VLP Law Group LLP; Kent H. Cheng

(57) ABSTRACT

The invention relates to semiconductor components, in particular to a scalable construction for lateral semiconductor components having high current-carrying capacity. A transistor cell according to the invention comprises a control electrode (203), a plurality of source fields (201) and a plurality of drain fields (202). The control electrode completely encloses at least one of the source fields or drain fields. A transistor according to the invention comprises a plurality of transistor cells on a substrate, each of which comprises a source contact field (206) and/or a drain contact field (207). The source contact fields are conductively connected to each other on the other side of the substrate and the drain contact fields are likewise conductively connected to each other on the other side of the substrate. The method according to the invention for producing a transistor comprises the following steps: providing a substrate; forming a plurality of transistor cells on the substrate, each of which comprises a control electrode, a plurality of source fields and a plurality of drain fields; conductively connecting the control electrodes to each other; forming a source contact field and/or a drain contact field in each transistor cell; conductively connecting the source contact fields of each transistor cell to a source contact field; conductively connecting the drain fields of each transistor cell to a drain contact field; forming at least one bump (208) on each of the source contact fields and on each of the drain contact fields; providing a circuit board; conductively connecting the bumps of the source contact fields to each other by means of conductive tracks on the circuit board; and conductively connecting the bumps of the drain contact fields to each other by means of conductive tracks on the circuit board. The arrangement of the bumps and the conductive tracks on the circuit board makes a low semiconductor surface assignment by wiring possible. The arrangement according to the invention of the source fields, drain fields and control electrodes relative to the bumps makes a low heat resistance possible between the active transistor regions and the bumps.

8 Claims, 2 Drawing Sheets

US 8,901,671 B2

SCALABLE CONSTRUCTION FOR LATERAL SEMICONDUCTOR COMPONENTS HAVING HIGH CURRENT-CARRYING CAPACITY

PRIORITY CLAIM

This is a U.S. national stage of application No. PCT/EP2011/051985, filed on Feb. 10, 2011. Priority is claimed on the following applications: German Application No.: 10 2010 001 788.4 Filed on Feb. 10, 2010, the contents of which are incorporated here by reference.

BACKGROUND OF THE INVENTION

The invention relates to a transistor cell, to a transistor, in particular to a lateral transistor having a high current-carrying capacity, to a method for producing a transistor as well as to a diode.

Due to a contact between a gallium nitride (GaN) layer and an aluminum gallium nitride (AlGaN) layer, gallium-nitride-based transistors may have a highly conductive layer at the AlGaN/GaN interface that can be used as a transistor channel of a field-effect transistor. The conductive layer is contacted via two metal faces that are deposited on the semiconductor surface and represent the source and the drain of the transistor. A control electrode deposited between the source and the drain onto the surface is used as a gate of the field-effect transistor. Such a construction is characterized in that all three transistor terminals are accessible via the top side of the semiconductor and in that the current in the transistor channel flows parallel to the semiconductor surface. Such a transistor construction is referred to as lateral component. In contrast thereto, many transistors (e.g., in silicon technology) are designed as vertical components, wherein at least one transistor terminal, usually the source or the drain, can be contacted from the lower side of the semiconductor substrate.

The development of GaN-based field-effect transistors having a gate made of a Schottky metal (HEMT) or having a gate made of a metal insulated by a dielectric (MISFET) is well advanced for applications as microwave amplifiers. Typically, such components have gate widths of less than 100 mm, wherein the arrangement of the source, drain and gate electrodes on the semiconductor surface is determined by the peculiarities of electric signal propagation in the frequency range of microwaves and results in alternating source fields and drain fields that are arranged one below the other and between which the gate electrodes are arranged. Usually, the gate electrodes are electrically conductively connected to each other on one side thereof at the side of the source fields and drain fields.

The development of GaN-based transistors as switching transistors in the field of power electronics is less advanced. In this field, transistors having a higher pulse-current-carrying capacity (typically, more than 50 A) and having a greater gate width (typically, more than 100 mm) are required. Since the desired switching frequencies in the field of power electronics are much lower than 1 GHz and the length of the electromagnetic waves can thus be considered as being very large as against the transistor dimensions, there is more freedom with regard to the arrangement of the source, drain and gate electrodes on the semiconductor surface.

Thus, it is obvious that the lateral construction of a GaN-based transistor for switching in the field of power electronics may differ from the construction of a GaN-based microwave transistor as well as from the construction of a vertical switching transistor for power electronics. Attention must be particularly turned to the efficient use of the semiconductor surface since the costs per semiconductor surface are particularly high with GaN-based semiconductors.

SUMMARY OF THE INVENTION

An object of the present invention is to provide a transistor construction that uses the available semiconductor surface as efficiently as possible and achieves a current-carrying capacity that is as high as possible for a given semiconductor surface. The transistor construction should be structured in such a manner that simple scaling of the current-carrying capacity of the transistors is possible. The electrically active regions should be arranged in such a manner that the temperature of the electrically active regions that develops during transistor operation is distributed on the semiconductor as constantly as possible.

These objects are achieved by a transistor cell with the features of the present invention, by a transistor with the features of the present invention and by a method of the present invention, respectively.

The inventive transistor cell comprises a control electrode, a plurality of source fields and a plurality of drain fields. The control electrode completely encloses at least one of the source fields and/or drain fields, whereby an active transistor region is made possible on all edges of the at least one of the source fields and/or drain fields.

While the various construction types presented herein are based on the technology of lateral GaN-based transistors, they are applicable to the same extent to lateral transistors that are based on other semiconductor technologies (e.g., to field-effect transistors and bipolar transistors). Herein, the terminals of general transistors are generally referred to as control electrode, source and drain, which may be, e.g., the base, the emitter and the collector of a bipolar transistor or the gate, the source and the drain of a field-effect transistor, i.e., a control electrode may be, e.g., a base or a gate, a source may be, e.g., an emitter or a source, and a drain may be, e.g., a collector or a drain. Herein, a source field is a region on a semiconductor surface that is designed to function as a part of a source, and a drain field is a region on a semiconductor surface that is designed to function as a part of a drain.

The inventive transistor cell may also have a source contact field and/or a drain contact field, wherein the source fields are conductively connected to the source contact field and/or the drain fields are conductively connected to the drain contact field, wherein a source contact field is a region on a semiconductor surface that is used to establish the contact to one or several source field/s and a drain contact field is a region on a semiconductor surface that is used to establish the contact to one or several drain field/s. If a transistor cell has both a source contact field and a drain contact field, the source fields may be connected to the source contact field and the drain fields may be connected to the drain contact field. On the other hand, if a transistor cell only has a source contact field, the drain fields of the transistor cell may be connectable to drain contact fields of one or several other transistor cell/s. Accordingly, the source fields of the transistor cell may be connectable to source contact fields of one or several other transistor cell/s if the transistor cell only has a drain contact field.

Preferably, the source contact field and/or the drain contact field of the inventive transistor cell has at least one bump that is conductively connectable to a circuit board, thereby achieving that the source fields and/or the drain fields of the transistor cell are connectable to a circuit board as easily as possible, wherein a bump is a structure (e.g., made of solder) that is deposited on a contact field in order to make contacting the contact field from the other side of the semiconductor surface possible.

Preferably, the at least one bump is designed to remove the generated dissipated heat. The control electrode may be concentrically arranged around the at least one bump, thereby minimizing the heat resistance between the active transistor region and the at least one bump so that the at least one bump can be used to remove the dissipated heat of the transistor towards the circuit board in a particularly efficient manner. Preferably, the concentric control electrode and the active transistor region connected thereto are arranged in such a manner that the temperature of the active transistor region that develops during transistor operation does not increase with increasing distance from the at least one bump.

In a preferred embodiment of the inventive transistor cell, the source fields and/or the drain fields are rectangular, thereby achieving a particularly simple surface-filling arrangement. In a further preferred embodiment of the inventive transistor cell, the control electrode has a hexagonal arrangement, thereby achieving that the semiconductor surface can be completely filled with source fields and drain fields with bumps arranged in the center thereof. In still a further preferred embodiment of the inventive transistor cell, the control electrode has a polygonal arrangement, wherein the number of edges of the polygons is an integral multiple of 4, thereby achieving that the source fields and the drain fields can be connected to the source contact fields and the drain contact fields, respectively, via a metal bridge in a particularly simple manner.

The inventive transistor of the present invention comprises a plurality of transistor cells on a semiconductor surface, wherein each transistor cell comprises a source contact field and/or a drain contact field. The source contact fields are conductively connected to each other on the other side of the semiconductor surface and the drain contact fields are also conductively connected to each other on the other side of the semiconductor surface, thereby achieving that the high source and drain currents of the interconnected transistor cells do not flow on the semiconductor surface level so that wiring on the semiconductor surface is reduced and current-carrying capacity can be increased. Preferably, each transistor cell has the preferred features described above.

Preferably, the transistor cells on the semiconductor surface are laterally fitted together. Preferably, the bumps of the source contact fields are conductively connected to each other by means of conductive tracks on a circuit board and the bumps of the drain contact fields are also conductively connected to each other by means of conductive tracks on the circuit board. Preferably, the thermal conductivity of the circuit board is high. As against the wire bond connections usually used in the field of power electronics, chip bonding via a bump is characterized by lower inductance, whereby very fast transistors are made possible.

Preferably, the control electrodes of the transistor cells are conductively connected to each other on a substrate that is not the substrate on which the source contact fields and the drain contact fields are conductively connected to each other. In particular, the control electrodes of the transistor cells may be conductively connected to each other on the semiconductor surface level.

In the inventive transistor, the high source and drain currents of the interconnected transistor cells do not flow on the chip level but preferably on a circuit board so that a substantial part of the transistor wiring levels is shifted from the expensive semiconductor surface to a comparatively very cheap circuit board. Moreover, thick copper tracks can be created on circuit boards in a particularly simple manner, which copper tracks have a higher conductivity than (with the same cross-sectional area as) conductive tracks that can be realized on the semiconductor surface by vapor deposition or sputtering.

The individual transistor cells are capable of functioning independently of each other on the wafer level, i.e., prior to the flip-chip mounting of the transistor on the circuit board. This provides the possibility of electrically characterizing the transistor by electrically characterizing its transistor cells, wherein the current-carrying capacity of the used set-up of measuring instruments must only correspond to the transistor cells, fault localization in individual transistor cells is possible, and the straggling of the parameters of individual cells of the transistor can be determined. Moreover, in transistors having a very high number of cells, individual faulty cells can be eliminated by omitting the corresponding bumps in the transistor.

The inventive method for producing a transistor comprises the following steps: providing a substrate; forming a plurality of transistor cells on the substrate, each of which comprising a control electrode, a plurality of source fields and a plurality of drain fields; conductively connecting the control electrodes to each other; forming a source contact field and/or a drain contact field in each transistor cell; conductively connecting the source fields of each transistor cell to a source contact field; conductively connecting the drain fields of each transistor cell to a drain contact field; forming at least one bump on each of the source contact fields and on each of the drain contact fields; providing a circuit board; conductively connecting the bumps of the source contact fields to each other by means of conductive tracks on the circuit board; and conductively connecting the bumps of the drain contact fields to each other by means of conductive tracks on the circuit board.

A further object of the present invention is to provide a diode construction having the advantages described above.

This object is achieved by a diode with the features of the present invention. The inventive diode comprises a plurality of diode cells on a semiconductor surface, wherein each diode cell comprises a cathode contact field and/or an anode contact field. The cathode contact fields are conductively connected to each other on the other side of the semiconductor surface and the anode contact fields are also conductively connected to each other on the other side of the semiconductor surface, thereby achieving that the high cathode and anode currents of the interconnected diode cells do not flow on the semiconductor surface level so that wiring on the semiconductor surface is reduced and current-carrying capacity can be increased.

BRIEF DESCRIPTION OF THE DRAWINGS

In the following, exemplary embodiments of the invention will be explained in greater detail on the basis of the associated drawings in which.

DETAILED DESCRIPTION OF THE PRESENTLY PREFERRED EMBODIMENTS

Figure 1:
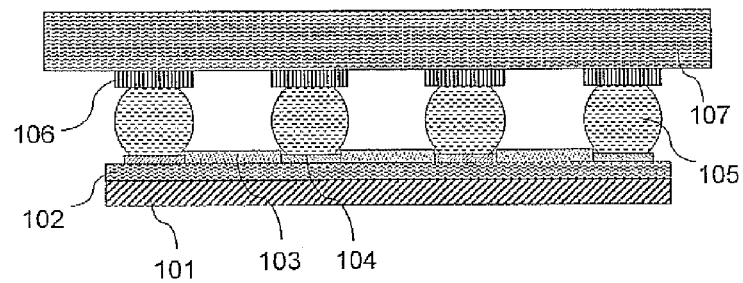
FIG. 1 shows a schematic cross-sectional view of an inventive transistor.

FIG. 1 shows the cross-section of an inventive transistor by way of example. The transistor is divided into several identical transistor cells 103 on the semiconductor surface 102, which semiconductor surface 102 may be located on a substrate 101. Each individual transistor cell 103 is a transistor capable of functioning. The control electrodes of all transistor cells of the transistor are connected to each other on the semiconductor surface. Different from usual, the sources and drains of the transistor cells are not completely interconnected on the semiconductor surface. Each of the source and drain contact fields 104 of the transistor cells is provided with a bump 105. Moreover, the control electrode contact of the complete transistor is provided with one or several bumps. According to a flip-chip method, the bumps are connected to conductive tracks 106 on a circuit board 107 that represents a circuit board type usually used in electronic construction technology. Preferably, the thermal conductivity of the circuit board 107 is high. The conductive tracks on the circuit board are arranged in such a manner that they connect all source bumps and drain bumps, respectively, in parallel in such a manner that all transistor cells make up a transistor that is connected in parallel and has a high current-carrying capacity. The size of the transistor cells is selected such that their current-carrying capacity is adapted to that of the bump contacts.

Figure 2:
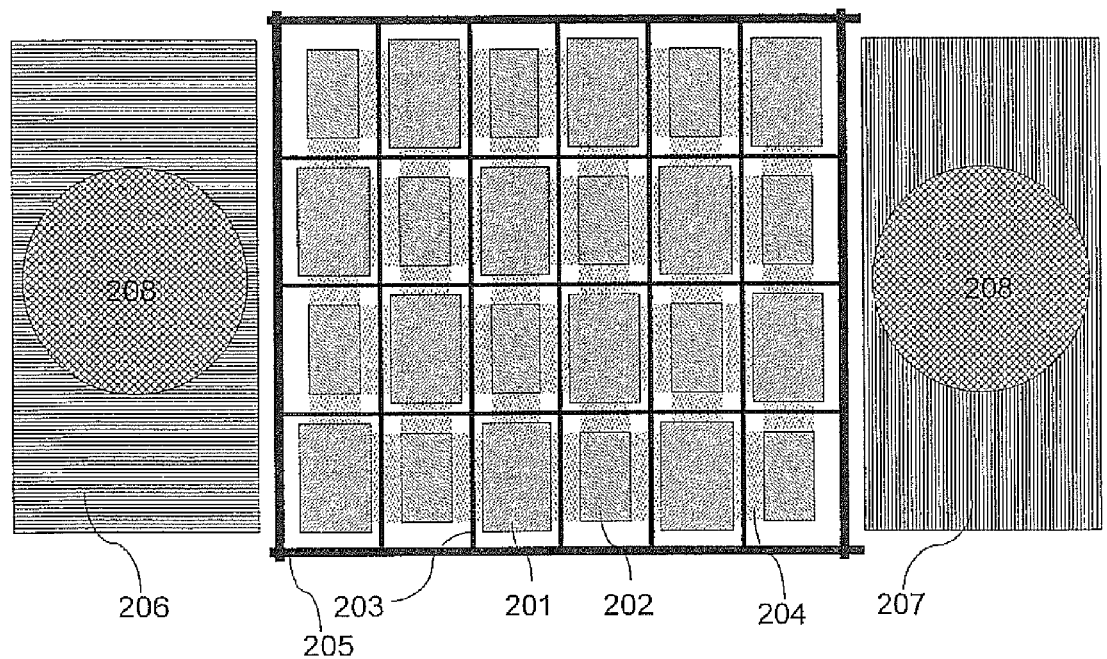
FIG. 2 shows a top view of a first exemplary embodiment of an inventive transistor cell.
Figure 3:
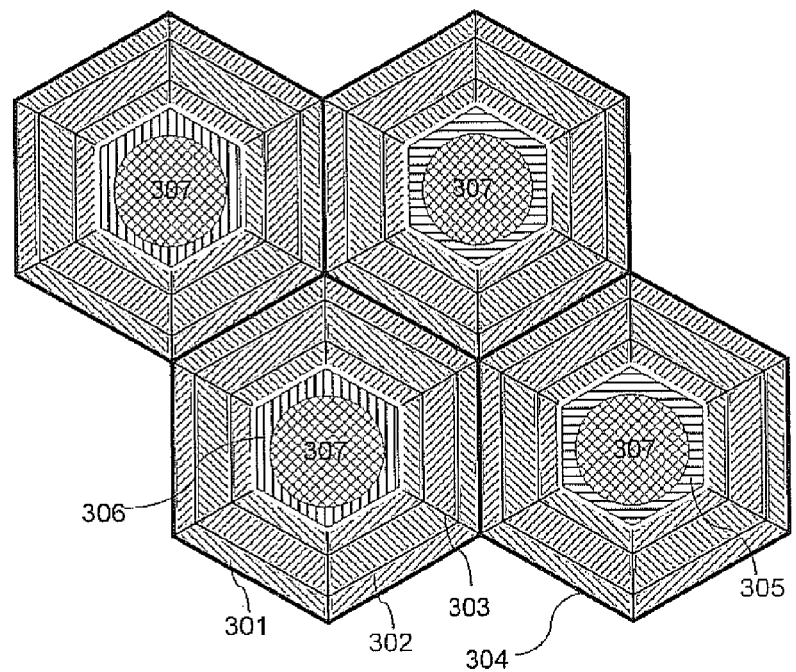
FIG. 3 shows a top view of a second exemplary embodiment of inventive transistor cells.
Figure 4:
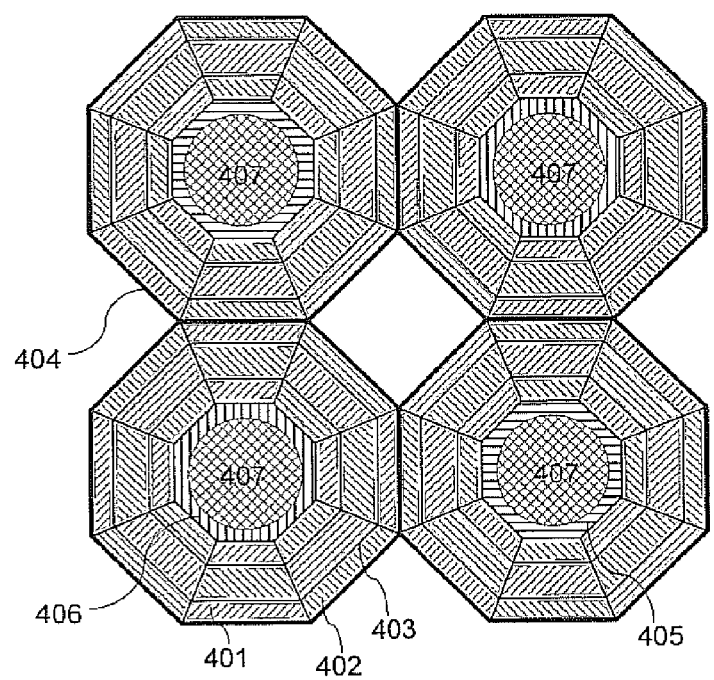
FIG. 4 shows a top view of a third exemplary embodiment of inventive transistor cells.

FIGS. 2, 3 and 4 show top views of exemplary embodiments of inventive transistor cells. The transistor cells are arranged on the semiconductor surface in the form of a sequence of alternating source fields 201, 301, 401 and drain fields 202, 302, 402 that are separated from each other by a reticulate, coherent control electrode 203, 303, 403 so that an active transistor region 204 on all edges of the source and drain fields is made possible provided that the corresponding field is not located on an outside of the transistor cell. The control electrodes 203, 303, 403 of different transistor cells are electrically conductively connected to each other by metal strips 205, 304, 404 that are arranged on the semiconductor level.

In a first possible embodiment shown in FIG. 2, the source and drain fields 201 and 202 are rectangular. The source contact fields 206 and drain contact fields 207 with the bumps 208 are located on opposite sides of the field with the active transistor regions. The electrically conductive connection between the source and drain fields and the associated contact fields is realized by means of metal bridges that may be realized in the form of air bridges or of bridges over a dielectric, which dielectric is open over the source or drain fields to be contacted.

In a second possible embodiment shown in FIG. 3 and a third possible embodiment shown in FIG. 4, the source and drain fields 301, 401 and 302, 402, respectively, are concentrically arranged around a source or drain contact field 305, 405 and 306, 406, respectively, with a bump 307, 407. The control electrodes 303, 403 make up a network of concentric and radial metallization elements that are electrically conductively connected to the control electrodes of the remaining transistor cells of the transistor by means of metal strips 304, 404 that are arranged on the semiconductor level. The advantage of the embodiments shown in FIGS. 3 and 4 consists in the minimized heat resistance between the active transistor region and the bump that can be used to remove the dissipated heat of the transistor towards the circuit board in a particularly efficient manner. Moreover, the concentric arrangement of the control electrodes enables the distance between them to be increased with increasing distance from the bump in such a manner that the temperature on the semiconductor surface that develops during transistor operation does not increase with increasing distance from the bump. The source and drain fields are contacted in the same manner as in the first embodiment described above, wherein the source fields that are located in transistor cells that have a source contact field are connected to this source contact field, and the source fields that are located in transistor cells that have a drain contact field are connected to the source contact field of an adjacent transistor cell. The same applies to the drain fields.

If the arrangement of the control electrodes is hexagonal (as shown with four transistor cells in FIG. 3), the semiconductor surface can be completely filled with source and drain fields with source or drain bumps 307 arranged in the center thereof.

If the arrangement of the control electrodes is octagonal (as shown with four transistor cells in FIG. 4), a transistor cell having a central source contact field 405 is surrounded on all sides by transistor cells having a central drain contact field 406, and vice versa. The advantage of this arrangement consists in the fact that the individual source and drain fields 401 and 402 can be connected to the source and drain contact fields 405 and 406 via a metal bridge in a particularly simple manner.

The advantages described with respect to the octagonal embodiment shown in FIG. 4 apply to all bump-centered polygonal embodiments in which the number of edges of the polygons is an integral multiple of 4. Other embodiments of the lateral arrangements of the source and drain fields with the intermediate control electrodes are possible.

Each of the embodiments described above can also be applied to an inventive diode construction. To this end, it is necessary in each case to omit the control electrodes and their contacts and to replace the source fields with cathode fields, to replace the source contact fields with cathode contact fields, to replace the drain fields with anode fields, and to replace the drain contact fields with anode contact fields. The cathode contact fields are conductively connected to each other on the other side of the semiconductor surface to form a cathode, and the anode contact fields are conductively connected to each other on the other side of the semiconductor surface to form an anode. This results in a diode that has a high current-carrying capacity and efficiently uses the semiconductor surface.

LIST OF REFERENCE NUMERALS 101 substrate
102 semiconductor surface
103 transistor cell
104 source contact field/drain contact field
105 bump
106 conductive track
107 circuit board
201, 301, 401 source field
202, 302, 402 drain field
203, 303, 403 control electrode
204 active transistor region
205, 304, 404 metal strip
206, 305, 405 source contact field
207, 306, 406 drain contact field
208, 307, 407 bump

The invention claimed is:
1. A transistor comprising:
at least a first and a neighboring second transistor cell, each comprising:
a contact field which has at least one bump that is conductively connectable to a circuit board, a control electrode which makes up a network of concentric and radial metallization with respect to the at least one bump;
a plurality of source fields; and
a plurality of drain fields,
wherein the source fields and the drain fields are concentrically arranged around the contact field,
wherein
the control electrode completely encloses at least one of the source fields and at least one of the drain fields, and
wherein the source fields of the first and the second transistor cell are conductively connected to the contact field of the first transistor cell and the drain fields of the first and the second transistor cell are conductively connected to the contact field of the second transistor cell.

2. A transistor cell according to claim 1,
wherein
the concentric metallizations are distanced from each other increasingly with increasing distance from the bump such that the temperature of the control electrode that develops during transistor operation does not increase with increasing distance from the at least one bump.

3. A transistor cell according to claim 1,
wherein
the control electrode has a hexagonal arrangement.

4. A transistor cell according to claim 1,
wherein
the control electrode has a polygonal arrangement, wherein the number of edges of the polygons is an integral multiple of 4.

5. A transistor according to claim 1 having a plurality of first and neighboring second transistor cells wherein the transistor cells are arranged on a semiconductor surface wherein the bumps of the contact fields of the first transistor cells are connected to each other by connective paths on the circuit board wherein the bumps of the contact fields of the second transistor cells are connected to each other by further connective paths on the circuit board.

6. A transistor according to claim 5,
wherein
the transistor cells on the semiconductor surface are laterally fitted together.

7. A transistor according to claim 5,
wherein
the control electrodes of the transistor cells are conductively connected to each other on a substrate that is not the substrate on which the source contact fields and the drain contact fields are conductively connected to each other.

8. A method for producing a transistor, comprising:
providing a semiconductor surface;
forming at least a first and a neighboring second transistor cell on the semiconductor surface, each of which comprising a control electrode arranged between a plurality of laterally arranged source fields and a plurality of laterally arranged drain fields; and conductively connecting the control electrodes to each other,
forming a contact field in each transistor cell such that the source fields and the drain fields are arranged concentrically around the contact field;
conductively connecting the source fields of the first and the second transistor cell to the contact field of the first transistor cell such that the first transistor cell comprises a source contact field;
conductively connecting the drain fields of the first and the second transistor cell to the contact field of the second transistor cell such that the second transistor cell comprises a drain contact field;
forming at least one bump on each of the source contact fields and on each of the drain contact fields;
providing a circuit board;
conductively connecting the bumps of the source contact fields to each other by means of conductive tracks on the circuit board; and
conductively connecting the bumps of the drain contact fields to each other by means of further conductive tracks on the circuit board,
wherein,
in each of the transistor cells, the control electrode is formed in such a manner that it completely encloses at least one of the source fields and at least one of the drain fields and wherein,
in each of the transistor cells, the control electrode makes up a network of concentric and radial metallization with respect to the at least one bump.

* * * * *